US007729497B2

(12) United States Patent
Van Reck

(10) Patent No.: US 7,729,497 B2
(45) Date of Patent: Jun. 1, 2010

(54) AUDIO SIGNAL ENHANCEMENT

(75) Inventor: Kristof Van Reck, Leuven (BE)

(73) Assignee: Koninklijke Philips Electronics N.V., Eindhoven (NL)

( * ) Notice: Subject to any disclaimer, the term of this patent is extended or adjusted under 35 U.S.C. 154(b) by 468 days.

(21) Appl. No.: 10/596,838

(22) PCT Filed: Jan. 10, 2005

(86) PCT No.: PCT/IB2005/050110

§ 371 (c)(1), (2), (4) Date: Jun. 27, 2006

(87) PCT Pub. No.: WO2005/069679

PCT Pub. Date: Jul. 28, 2005

(65) Prior Publication Data

US 2007/0274538 A1 Nov. 29, 2007

(30) Foreign Application Priority Data

Jan. 13, 2004 (EP) .................................. 04100092

(51) Int. Cl.
*H03G 3/00* (2006.01)

(52) U.S. Cl. ......................... 381/61; 381/102; 381/107; 381/98

(58) Field of Classification Search ........... 381/98–109, 381/61, 62
See application file for complete search history.

(56) References Cited

U.S. PATENT DOCUMENTS

| | | | | | |
|---|---|---|---|---|---|
| 5,359,665 | A * | 10/1994 | Werrbach | 381/102 |
| 5,509,080 | A * | 4/1996 | Roberts | 381/98 |
| 6,111,960 | A * | 8/2000 | Aarts et al. | 381/61 |
| 6,285,767 | B1 * | 9/2001 | Klayman | 381/17 |
| 6,606,388 | B1 * | 8/2003 | Townsend et al. | 381/17 |
| 6,845,165 | B1 * | 1/2005 | Motohashi et al. | 381/98 |
| 7,242,779 | B2 * | 7/2007 | Coats et al. | 381/61 |
| 2003/0044024 | A1 * | 3/2003 | Aarts et al. | 381/61 |

* cited by examiner

*Primary Examiner*—Vivian Chin
*Assistant Examiner*—Jason R Kurr

(57) ABSTRACT

An audio signal (A) is enhanced by dividing the signal into time segments of a selected frequency range and scaling the audio signal in each time segment. The time segments (S) are defined by zero crossings (Z) of the audio signal, thus avoiding the introduction of any undesired harmonics. The scaling may involve linear or non-linear scaling factors. When the selected frequency range comprises bass frequencies, a very effective and distortion-free bass enhancement is obtained.

27 Claims, 3 Drawing Sheets

AUDIO SIGNAL ENHANCEMENT

Figure 1:
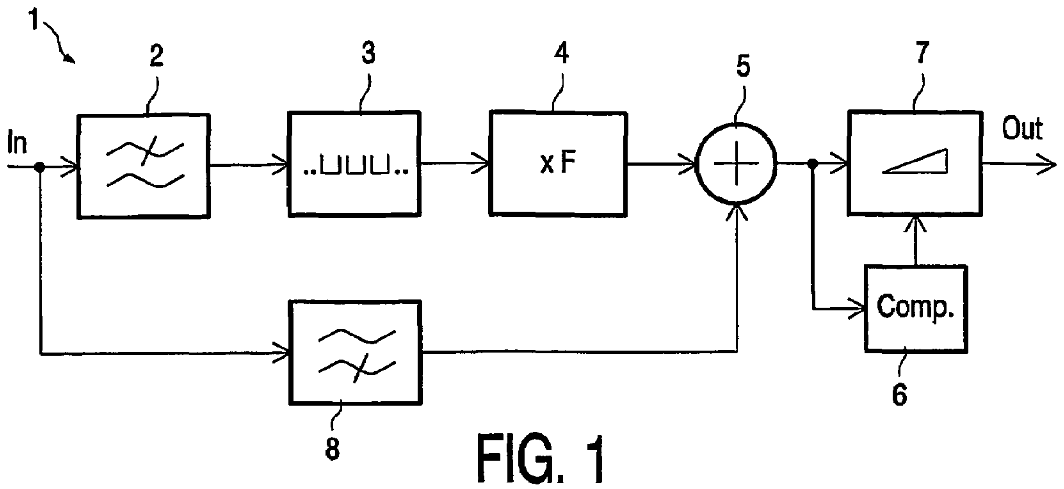

The present invention relates to audio signal enhancement. More in particular, the present invention relates to a method and a device for improving the perceived quality of an audio signal.

It is well known to enhance audio signals, for example by amplifying one frequency range more strongly than another frequency range. In this way, it is possible to "boost" higher and lower frequencies which are typically perceived to be less loud than mid-range frequencies. However, it has been found that many transducers are not capable of rendering high and low frequencies at an appreciable sound level without introducing distortion. This is especially a problem for low audio frequencies or "bass" frequencies.

It has been proposed to enhance an audio signal by adding harmonics of the bass frequencies as disclosed in, for example, U.S. Pat. No. 6,111,960. The enhancement signals are produced by a harmonics generator and then added to the (amplified) original audio signal. The added harmonics are perceived as an amplified bass signal. It has further been proposed to add sub-harmonics of the audio signal to create the impression of bass enhancement.

Although adding harmonics or sub-harmonics provides a significant improvement of the audio signal, some listeners are not entirely content with the resulting enhanced audio signals, as in some audio signals these techniques may introduce artifacts due to the gain control mechanism used.

It is therefore an object of the present invention to overcome these and other problems of the Prior Art and to provide a method of and a device for enhancing audio signals which introduce substantially no artifacts or distortion.

Accordingly, the present invention provides a method of enhancing an audio signal, the method comprising the steps of:

- filtering the audio signal so as to select a frequency range,
- dividing the audio signal of the selected frequency range into time segments, and
- scaling the audio signal in each time segment so as to increase the sound level of the audio signal in said frequency range, wherein the time segments are defined by zero crossings of the filtered audio signal.

By dividing the audio signal into time segments defined by zero crossings of the audio signal, it is possible to scale the signal in each time segment without introducing any substantial distortion. By scaling the signal per time segment, a very precise scaling may be achieved, increasing the sound level of the audio signal while avoiding any signal distortion. By applying this scaling per time segment only on a selected frequency range, it is possible to increase the sound level of this frequency range relative to the remainder of the audio signal.

It is noted that scaling audio signals using time segments defined by zero crossings is known per se from U.S. Pat. No. 5,672,999. However, the scaling of U.S. Pat. No. 5,672,999 is carried out for an entirely different purpose: to avoid "clipping", that is, to avoid the signal distortion caused by audio signals having an amplitude which is too large and which needs to be scaled down. In contrast, the present invention relates to audio signal amplitudes which typically have to be scaled up to enhance specific signal components. Also, the clipping avoidance apparatus of U.S. Pat. No. 5,672,999 scales all frequencies of the audio signal, while the method and device of the present invention scale only the signal components of a selected frequency range.

In the present invention, the boundaries of the time segments correspond with zero crossings of the audio signal of the selected frequency range, so as to avoid any signal distortions or the introduction of any undesired harmonics. Of course any time segment could comprise multiple sections, each section being bounded by two zero crossings, the time segment thereby extending over one or more zero crossings. It is preferred, however, that each time segment is defined by two consecutive zero crossings of the filtered audio signal. In the preferred embodiment, therefore, no zero crossings lie within a time segment and all zero crossings define time segment boundaries. This allows a more precise scaling of the audio signal as the time segments are as small as possible while retaining the benefit of zero crossing defined boundaries.

It is of course possible to apply a single scaling factor to all or a plurality of time segments, thus providing a substantially uniform scaling. It is preferred, however, that the step of scaling the audio signal involves a distinct scaling factor for each time segment That is, for each time segment a new scaling factor is determined. Of course the numerical value of this scaling factor may prove to be identical to that of another time segment. A separate scaling factor for each time segment allows a very well-defined and precise scaling of the audio signal.

Several types of scaling factors may be utilized. In a practical embodiment, the step of scaling involves a constant scaling factor. This embodiment has the advantage of being simple yet effective. However, in other embodiments the step of scaling involves a variable scaling factor, that is, a scaling factor that varies with the amplitude with the signal. As a result, the scaling factor may for example decrease with the amplitude, applying a greater "boost" to low amplitude signals than to high amplitude signals. Such a variable scaling factor may be either linear or non-linear. Advantageous non-linear scaling factors may involve a quadratic or cubic function.

The scaling discussed above is applied to a selected frequency range of the audio signal. The method of the present invention preferably comprises the further step of:

- combining the scaled audio signal of the selected frequency range and the remained of the audio signal of the previously not selected frequency range.

This provides a combined output signal in which both the enhanced part of the audio signal and the remainder of the audio signal is present.

In a preferred embodiment, the method of the present invention further comprises the steps of:

- comparing the amplitude of the combined audio signal with a threshold value, and
- adjusting the amplitude of the audio signal if the threshold is exceeded.

This provides a check on the enhanced audio signal and prevents any "clipping" of the signal. In this way, the audio signal which was scaled up in a previous step may be scaled down (to a limited extent) in this further step to avoid any signal distortion. It is preferred that only the amplitude of the audio signal of the selected frequency range is adjusted. It would be possible to adjust the amplitude of the entire audio signal, that is both the selected (and scaled) frequency range and the remainder of the audio signal, but that would result in a scaling down of the remainder of the audio signal, which is generally not desirable. By only adjusting the audio signal of the selected frequency range, any excessive enhancement can be compensated for.

It is possible to compare and adjust several time segments, or even the entire audio signal, substantially simultaneously.

However, it is preferred that the steps of comparing the amplitude of the combined audio signal and a threshold value, and adjusting the amplitude of the combined audio signal is carried out per time segment. This allows a more accurate adjustment and avoids scaling down many time segments altogether.

Although the selected frequency range can be chosen arbitrarily, in a particularly advantageous embodiment the selected frequency range is a bass frequency range. The present invention therefore provides a very advantageous method of bass enhancement or "bass boost". Bass audio frequencies are generally understood to lie in the range of 0 Hz to approximately 300 Hz, although other range boundaries may also be used, for example 20 Hz-200 Hz or 30 Hz-150 Hz.

The method of the present invention may advantageously comprise the further step of delaying any the signal components of other frequency ranges. That is, the part of the audio signal which is not of the selected frequency range may be delayed so as to compensated for any processing delay in the selected frequency range. This ensures that the frequency components of the selected frequency range and those of the remaining frequency ranges are available substantially simultaneously.

The present invention also provides a device for enhancing an audio signal, the device comprising:

filter means for filtering the audio signal so as to select a frequency range, dividing means for dividing the audio signal of the selected frequency range into time segments, and scaling means for scaling the audio signal in each time segment so as to increase the sound level of the audio signal in said frequency range, wherein the time segments are defined by zero crossings of the filtered audio signal.

Advantageously, the dividing means are arranged for defining each time segment by two consecutive zero crossings of the filtered audio signal.

A device according to the invention may be comprised in an audio (stereo) amplifier, a home cinema system, an announcement system or any other suitable audio apparatus.

The present invention further provides an audio system comprising a device as defined above.

The present invention will further be explained below with reference to exemplary embodiments illustrated in the accompanying drawings, in which:

FIG. 1 schematically shows a first embodiment of a device for enhancing audio signals according to the present invention.

Figure 2:
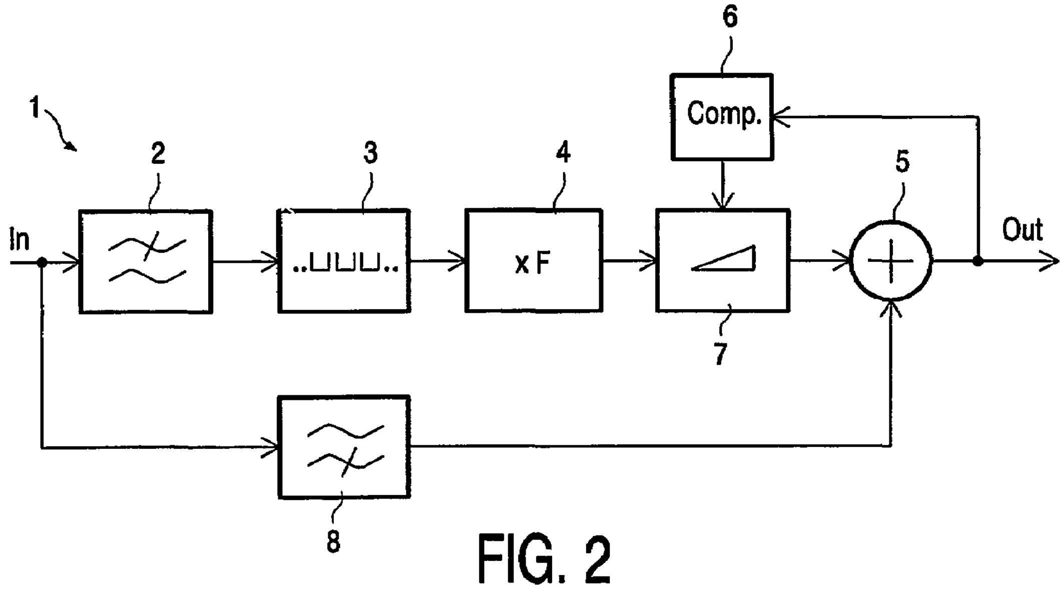

FIG. 2 schematically shows a second embodiment of a device for enhancing audio signals according to the present invention.

Figure 3:
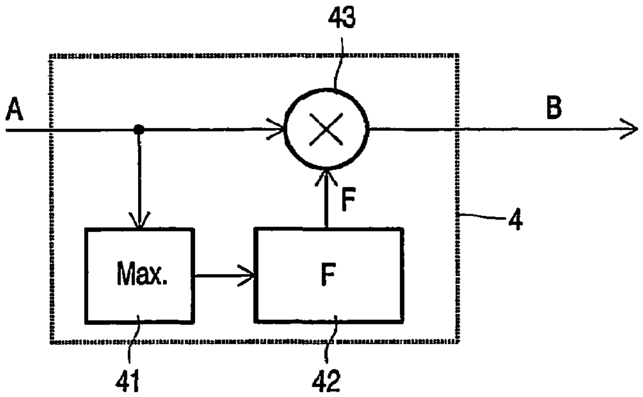

FIG. 3 schematically shows the scaling unit of the device of FIGS. 1 and 2 in more detail.

Figure 4A:
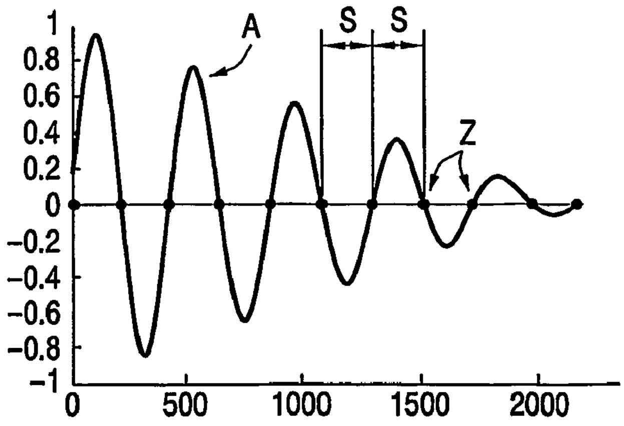
Figure 4B:
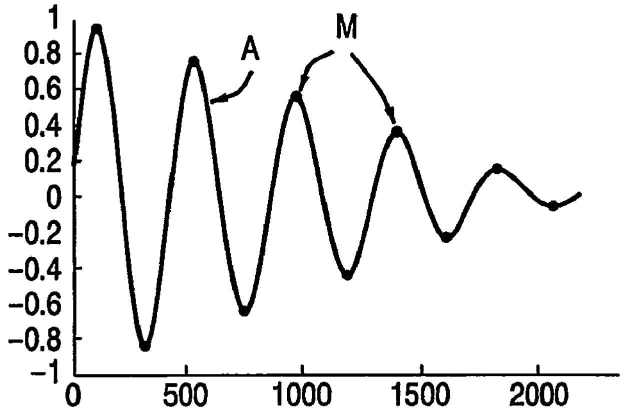
Figure 4C:
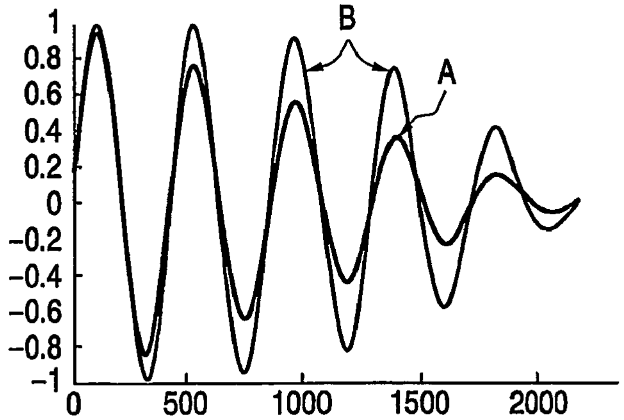

FIGS. 4*a*-*c* schematically show audio waveforms as used in the present invention.

Figure 5:
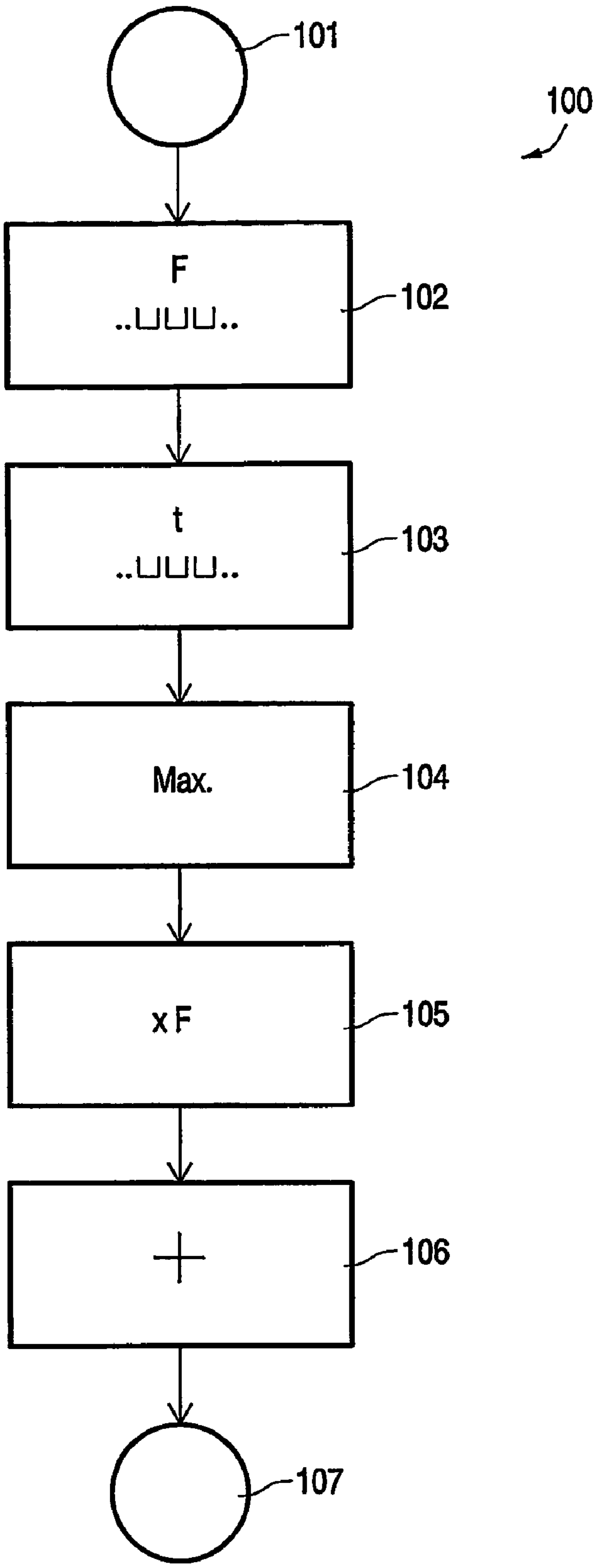

FIG. 5 schematically shows a method of enhancing audio signals in accordance with the present invention.

The device 1 shown merely by way of non-limiting example in FIG. 1 comprises a filter unit 2 for filtering the audio signal so as to select a frequency range, a segmenting unit 3 for dividing the audio signal of the selected frequency range into time segments, and a scaling unit 4 for scaling the audio signal in each time segment so as to increase the sound level of the audio signal in said frequency range. In the embodiment shown, the following optional units are also present: a combining unit 5, a comparison unit 6, an adjustment unit 7 and a delay/filter unit 8. Although it is possible to implement the device 1 using analog techniques, it will be assumed that the device 1 is arranged for digitally processing audio signals and that the audio signals are provided in digital form as samples. It will be understood that a sample-and-hold unit, known per se, could be added to the device 1 if the audio signal were available in analog form only.

The filter unit 2 selects a frequency range that will be subjected to signal enhancement according to the present invention. In a preferred embodiment the frequency range selected comprises bass frequencies, for example frequencies ranging from 0 Hz to approximately 300 Hz, although other frequency ranges are also possible, for example from 20 Hz to approximately 150 or 200 Hz. It has been found that the present invention is particularly suitable for providing "bass boost", that is, for enhancing the lower (bass) frequencies of an audio signal, although mid-range frequencies or higher frequencies can also be enhanced if desired.

The filtered audio signal of the selected frequency range is divided into time segments by a segmenting unit 3 which, in accordance with the present invention, comprises a zero crossing detector. Such detectors are known per se. According to the present invention, the filtered audio signal is divided into segments which are bounded by zero crossings. This is illustrated in FIG. 4*a* where an audio signal waveform A is shown to have zero crossings Z. In the preferred embodiment, a segment S is defined by two adjacent zero crossings, although segments could extend over zero crossings and be defined by, for example, each first and third zero crossing. However, the relatively small segments defined by neighboring zero crossings allow a more precise scaling and further processing of the audio signal. It may be advantageous to define a minimum time segment to ensure a minimum number of samples in each segment, a segment smaller than the minimum size being combined with an adjacent segment.

The scaling unit 4 scales each segment of the audio signal. Although it is possible to apply the same scaling factor (F) to each segment, the preferred embodiment of the device applies a distinct scaling factor (F) to each segment, or even to each sample as will be explained later. The scaling unit 4 typically scales up the audio signal of the selected frequency range: the amplitude of the signal (that is, of the samples) is typically increased so as to enhance the overall audio signal. In the present example, the bass frequencies of the audio signal are "boosted".

The enhanced audio signal of the selected (here: bass) frequency range is fed to the combination unit 5, where it is combined with the remainder of the audio signal. That is, the frequencies not passed by the filter 2 are fed to the combination unit 5 via the delay or additional filter unit 8. This unit 8 is preferably constituted by a complementary filter which passes those frequencies that are blocked by the filter 2. In the present example, the filter 2 can be a low-pass filter while the filter 8 may be a high-pass filter. The filters 2 and 8 may have approximately the same cut-off frequencies. Alternatively, the unit 8 is an all-pass filter which presents a delay for all frequencies to compensate for any delay in the parallel branch of units 2, 3 and 4. Embodiments can be envisaged in which the unit 8 merely is a through connection.

As mentioned above, the scaled audio signal of the selected frequency range and the un-scaled audio signal of the remaining frequencies are combined in the combining unit 5 to form a combined, enhanced audio signal. This combined audio signal may be output to a suitable transducer, such as a loudspeaker, possibly after amplification by a suitable amplifier. In the preferred embodiment of FIG. 1, however, an additional gain control check is made. To this end, the combined audio signal is fed to a comparator unit 6 for comparing the audio signal to a threshold. If the signal exceeds the threshold in any segment, the comparator unit 6 sends a corresponding adjustment factor to the adjustment unit 7 so as to reduce the audio signal level. The adjustment unit 7 may comprise a multiplier known per se for multiplying the combined audio signal by an adjustment factor determined by the comparator unit 6.

Of course other arrangements may be used for avoiding excessive signal levels. In an alternative embodiment (not shown), the input of comparator unit 6 is coupled to the output of filter unit 8 instead of to the output of combination unit 5, so as to receive the audio signal of the remaining frequencies which is to be combined with the scaled audio signal. The adjustment factor produced by the comparator unit 6 may then be fed to the scaling unit 4 so as to directly influence the scaling. In such an embodiment, the adjustment unit 7 may typically be omitted.

In the embodiment of FIG. 2, the adjustment unit 7 is arranged between the output of the scaling unit 4 and the input of the combining unit 5. The input of the comparator 6 is coupled to the output of the combining unit 5, as in the embodiment of FIG. 1. This arrangement provides a feedback loop for gain control. It is noted that in digital signal processing devices it is possible to re-process samples, so that signal components exceeding the amplitude threshold of comparator 6 may be scaled down before being output by the device of FIG. 2.

An exemplary embodiment of the scaling unit 4 is shown in more detail in FIG. 3. The unit 4 is shown to comprise a multiplier 43 for multiplying the audio signal by a scaling factor F which is determined by the scaling factor unit 42. A level detection unit 41 determines the maximum signal level for each time segment of the signal, preferably of every sample, and passes the signal level on to the scaling factor unit 42 which determines an appropriate scaling factor F. The level detection unit 41 may be known per se, while the scaling factor unit 42 may be suitably constituted by a semiconductor memory containing a look-up table. The scaling factor F may initially be equal to one and may be decreased in response to the output signal of level detection unit 41.

The operation of the device 1 is schematically illustrated in FIGS. 4*a*-*c* where a waveform A in FIG. 4*a* is shown to have multiple zero crossings Z. The waveform A is preferably produced by the filter 2 of FIGS. 1 and 2, and only contains frequencies of the selected frequency range. The segmenting unit 3 divides the waveform A into segments S which are each bounded by zero crossings Z (only two segments S are shown for the sake of clarity of the illustration). The level detection unit 41 of the scaling unit 4 then determines the maximum signal value M present in each segment, as illustrated in FIG. 4*b*. This maximum value M is subsequently used to determine the scaling factor F, resulting in a scaled-up waveform B as shown in FIG. 4*c*. It is noted that the numbers at the horizontal axes in FIGS. 4*a*-*c* refer to sample numbers, while the numbers at the vertical axes indicate normalized signal levels.

It is noted that in the present invention all signal samples between two zero crossing are multiplied by the same scaling factor. As a result, the waveform maintains its original shape and is not distorted. It is further noted that as each segment is processed substantially individually, the signal enhancement provided by the device 1 of the present invention is substantially instantaneous.

Several types of scaling factors may be used. The scaling factor F may be constant. This is illustrated in Table 1, where the signal values X (amplitudes of the waveform A of FIG. 4*a*) are multiplied by the scaling factor F to yield new signal values Y (amplitudes of the waveform B of FIG. 4*c*). As can be seen, the new signal values Y increase linearly with the signal values X.

TABLE 1

(constant factor F):

| Number | X | F = 1 | Y = X · F |
|---|---|---|---|
| 1 | 0.0 | 1.0 | 0.0 |
| 2 | 0.1 | 1.0 | 0.1 |
| 3 | 0.2 | 1.0 | 0.2 |
| 4 | 0.3 | 1.0 | 0.3 |
| 5 | 0.4 | 1.0 | 0.4 |
| 6 | 0.5 | 1.0 | 0.5 |
| 7 | 0.6 | 1.0 | 0.6 |
| 8 | 0.7 | 1.0 | 0.7 |
| 9 | 0.8 | 1.0 | 0.8 |
| 10 | 0.9 | 1.0 | 0.9 |
| 11 | 1.0 | 1.0 | 1.0 |

Alternatively, the scaling factor may be variable, typically varying with the signal values X so as to apply a larger scaling factor to smaller signal values. An example is illustrated in Table 2 where the scaling factor F varies linearly with the signal values X: $F=2-X$.

TABLE 2

| Number | X | F = 2 − X | Y = X · F |
|---|---|---|---|
| 1 | 0.0 | 2.0 | 0.00 |
| 2 | 0.1 | 1.9 | 0.19 |
| 3 | 0.2 | 1.8 | 0.36 |
| 4 | 0.3 | 1.7 | 0.51 |
| 5 | 0.4 | 1.6 | 0.64 |
| 6 | 0.5 | 1.5 | 0.75 |
| 7 | 0.6 | 1.4 | 0.84 |
| 8 | 0.7 | 1.3 | 0.91 |
| 9 | 0.8 | 1.2 | 0.96 |
| 10 | 0.9 | 1.1 | 0.99 |
| 11 | 1.0 | 1.0 | 1.00 |

In the example of Table 3, the scaling factor F is a quadratic function of the signal value X: $F=3-3X+X^2$. This results in an even stronger scaling of small signal values.

TABLE 3

| Number | X | $F = 3 - 3X + X^2$ | Y = X · F |
|---|---|---|---|
| 1 | 0.0 | 3.00 | 0.000 |
| 2 | 0.1 | 2.71 | 0.271 |
| 3 | 0.2 | 2.44 | 0.488 |
| 4 | 0.3 | 2.19 | 0.657 |
| 5 | 0.4 | 1.96 | 0.784 |
| 6 | 0.5 | 1.75 | 0.875 |
| 7 | 0.6 | 1.56 | 0.936 |
| 8 | 0.7 | 1.39 | 0.973 |
| 9 | 0.8 | 1.24 | 0.999 |
| 10 | 0.9 | 1.11 | 0.999 |
| 11 | 1.0 | 1.00 | 1.000 |

In still another embodiment, the scaling factor F is a cubic function of the signal values X, as illustrated in Table 4: $F=4-6X+4X^2-X^3$.

TABLE 4

| Number | X | $F = 4 - 6X + 4X^2 - X^3$ | Y = X · F |
|---|---|---|---|
| 1 | 0.0 | 4.000 | 0.000 |
| 2 | 0.1 | 3.439 | 0.344 |

TABLE 4-continued

| Number | X | $F = 4 - 6X + 4X^2 - X^3$ | $Y = X \cdot F$ |
|---|---|---|---|
| 3 | 0.2 | 2.952 | 0.590 |
| 4 | 0.3 | 2.533 | 0.760 |
| 5 | 0.4 | 2.176 | 0.870 |
| 6 | 0.5 | 1.875 | 0.936 |
| 7 | 0.6 | 1.624 | 0.974 |
| 8 | 0.7 | 1.417 | 0.992 |
| 9 | 0.8 | 1.248 | 0.998 |
| 10 | 0.9 | 1.111 | 0.999 |
| 11 | 1.0 | 1.000 | 1.000 |

The above scaling factors all have the common characteristic of always increasing with an increasing value of X. This is not essential and embodiments can be envisaged in which the scaling factor first increases and then slightly decreases, as illustrated in table 5 where F=3−2X.

TABLE 5

| Number | X | $F = 3 - 2X$ | $Y = X \cdot F$ |
|---|---|---|---|
| 1 | 0.0 | 3.0 | 0.00 |
| 2 | 0.1 | 2.8 | 0.28 |
| 3 | 0.2 | 2.6 | 0.52 |
| 4 | 0.3 | 2.4 | 0.72 |
| 5 | 0.4 | 2.2 | 0.88 |
| 6 | 0.5 | 2.0 | 1.00 |
| 7 | 0.6 | 1.8 | 1.08 |
| 8 | 0.7 | 1.6 | 1.12 |
| 9 | 0.8 | 1.4 | 1.12 |
| 10 | 0.9 | 1.2 | 1.08 |
| 11 | 1.0 | 1.0 | 1.00 |

The same formula of the scaling factor F may apply to an entire signal or only to one or several time segments. That is, successive time segments may be scaled using different scaling factor formulae. Of course different scaling factor formulae in adjacent time segments are preferably chosen in such a way that discontinuities are avoided.

As can be seen from the tables above, the scaling factors corresponding with the signal values may suitably be stored in look-up tables. Advantageously, the scaling factor unit 42 of FIG. 3 contains multiple tables corresponding with multiple scaling factor formulae, the particular table used being determined by the type of audio signal or by suitable control signals. Such control signals may for example correspond with different settings of a selector switch that allows the user to select a particular type of "bass boost" or other signal enhancement.

The method of the present invention is illustrated in FIG. 5. After initiating the method in step 101 ("Begin"), the frequency range is selected in step 102 ("Frequency Segmentation" or "Select Frequency Range"). This selected frequency range is processed in accordance with the present invention. All other frequencies may be blocked but are preferably preserved to be combined with the processed signal in step 106.

In step 103 ("Time Segmentation" or "Determine Time Segments"), the audio signal of the selected frequency range is divided into time segments (S in FIG. 4*a*) bounded by zero crossings (Z in FIG. 4*a*) of the signal. In step 104 ("Detect Maxima"), a maximum value (M in FIG. 4*b*) is determined for each time segment. This maximum value is used to determine a scaling factor F for scaling the samples of the audio signal in step 105 ("Scale Samples"). In step 106 ("Combine with Other Frequency Ranges") the processed audio signal of the selected frequency range is combined with the un-processed audio signal of the remaining frequency ranges to produce a combined output signal. The method concludes in step 107 ("End").

It is noted that the schematic diagram of FIG. 5 assumes a time-limited set of audio signal samples. It is of course possible to operate on an audio signal in real time in accordance with the present invention, in which case the method as illustrated is essentially repeated and may be carried out continuously.

In the case of stereo audio signals it is advantageous to apply the scaling of the present invention to a combined (left+right) signal as this avoids duplication of processing. Most of the stereo information is retained by the audio signal of the remaining frequencies, allowing the audio signal of the selected frequencies to be combined.

The present invention is based upon the insight that dividing an audio signal into time segments bounded by zero crossings allows the signal to be scaled without introducing any substantial artifacts, such as undesired harmonics. The present invention benefits from the further insight that scaling an audio signal per time segment allows a very effective and distortion-free signal enhancement, for example "bass boost".

The present invention is well suited to be realized not only in dedicated hardware—such as an ASIC—but also in software to run on a dedicated or generic processor. The steps of the methods can hence be realized as a computer program product.

Under computer program product should be understood any physical realization of a collection of commands enabling a processor—generic or special purpose—, after a series of loading steps to get the commands into the processor, to execute any of the characteristic functions of an invention. In particular the computer program product may be realized as data on a carrier such as e.g. a disk or tape, data present in a memory, data traveling over a network connection—wired or wireless—, or program code on paper. Apart from program code, characteristic data required for the program may also be embodied as a computer program product.

It is noted that any terms used in this document should not be construed so as to limit the scope of the present invention. In particular, the words "comprise(s)" and "comprising" are not meant to exclude any elements not specifically stated. Single (circuit) elements may be substituted with multiple (circuit) elements or with their equivalents.

It will be understood by those skilled in the art that the present invention is not limited to the embodiments illustrated above and that many modifications and additions may be made without departing from the scope of the invention as defined in the appending claims.

The invention claimed is:

1. A method of enhancing an audio signal, the method comprising the steps of:

filtering, using a filter unit, the audio signal so as to select a frequency range thereby forming a filtered audio signal;

dividing, using a segmenting unit, the filtered audio signal of the selected frequency range into time segments thereby forming filtered audio signal time-segments, said filtered audio signal time-segments collectively being a replica of the filtered audio signal; and scaling, using a scaling unit, each of the filtered audio signal time-segments such that the scaled filtered audio signal time-segments collectively re-form the filtered audio signal with an increased sound level, wherein the time segments are defined by zero crossings of the filtered audio signal.

2. The method as claimed in claim 1, wherein each time segment is defined by two consecutive zero crossings of the filtered audio signal.

3. The method as claimed in claim 1, wherein the step of scaling the audio signal involves a distinct scaling factor for each time segment.

4. The method as claimed in claim 1, wherein the step of scaling involves a scaling factor which is constant for each time segment.

5. The method as claimed in claim 1, wherein the step of scaling involves a scaling factor which varies with the amplitude of the filtered audio signal.

6. The method as claimed in claim 5, wherein the step of scaling involves a non-linear scaling factor involving a quadratic or cubic function.

7. The method as claimed in claim 1, wherein said method further comprises the step of:

combining, in a combination unit, the scaled filtered audio signal segments of the selected frequency range and the remainder of the audio signal not in the selected frequency range, thereby forming a combined audio signal.

8. The method as claimed in claim 7, wherein said method further comprises the steps of:

comparing, using a comparator, an amplitude of the combined audio signal with a threshold value; and adjusting, using an adjustment unit, the amplitude of the combined audio signal if the threshold is exceeded.

9. The method as claimed in claim 8, wherein only the amplitude of the filtered audio signal is adjusted.

10. The method as claimed in claim 8, wherein the steps of comparing the amplitude of the combined audio signal and adjusting the amplitude of the combined audio signal is carried out per time segment.

11. The method as claimed in claim 1, wherein the selected frequency range is a bass frequency range.

12. The method as claimed in claim 1, wherein said method further comprises the step of:

delaying, in a delay unit, any signal components of the audio signal in frequency ranges other than said selected frequency range.

13. A computer-readable medium having stored thereon a computer program product comprising code enabling a processor to execute the method as claimed in claim 1.

14. A device for enhancing an audio signal, the device comprising:

filter means for filtering the audio signal so as to select a frequency range thereby forming a filtered audio signal;

dividing means for dividing the filtered audio signal of the selected frequency range into time-segments thereby forming filtered audio signal time-segments, said filtered audio signal time-segments collectively being a replica of the filtered audio signal; and scaling means for scaling each of the filtered audio signal segments such that the scaled filtered audio signal time-segments collectively re-form the filtered audio signal with an increased sound level, wherein the time segments are defined by zero crossings of the filtered audio signal.

15. The device as claimed in claim 14, wherein the dividing means defines each time segment by two consecutive zero crossings of the filtered audio signal.

16. The device as claimed in claim 14, wherein the scaling means uses a distinct scaling factor for each time segment.

17. The device as claimed in claim 14, wherein the scaling means uses a scaling factor which is constant for each time segment.

18. The device as claimed in claim 14, wherein the scaling means uses a scaling factor which varies with the amplitude of the filtered audio signal.

19. The device as claimed in claim 18, wherein the scaling means uses a non-linear scaling factor involving a quadratic or cubic function.

20. The device as claimed in claim 14, wherein said device further comprises:

combining means for combining the scaled filtered audio signal segments and the remainder of the audio signal not in the selected frequency range, thereby forming a combined audio signal.

21. The device as claimed in claim 20, wherein said device further comprises:

comparing means for comparing an amplitude of the combined audio signal with a threshold value; and adjusting means for adjusting the amplitude of the combined audio signal if the threshold is exceeded.

22. The device as claimed in claim 21, wherein the adjusting means adjusts only the amplitude of the filtered audio signal.

23. The device as claimed in claim 21, wherein the comparing means compares the amplitude of the combined audio signal per time segment, and the adjusting means adjusts the amplitude of the combined audio signal per time segment.

24. The device as claimed in claim 14, wherein the selected frequency range is a bass frequency range.

25. The device as claimed in claim 14, wherein said device further comprises:

a delay element for delaying signal components of the audio signal in frequency ranges other than said selected frequency range.

26. An audio amplifier comprising a device as claimed in claim 14.

27. An audio system comprising a device as claimed in claim 14.

* * * * *